(12) United States Patent
Vitt et al.

(10) Patent No.: US 7,793,415 B2
(45) Date of Patent: Sep. 14, 2010

(54) METHOD FOR SUPPRESSION OF EMI EMISSIONS

(75) Inventors: David P. Vitt, Sewell, NJ (US); Thomas J. Carullo, Marlton, NJ (US); Larry Cantwell, Moorestown, NJ (US)

(73) Assignee: OnPath Technologies, Lumberton, NJ (US)

( * ) Notice: Subject to any disclaimer, the term of this patent is extended or adjusted under 35 U.S.C. 154(b) by 406 days.

(21) Appl. No.: 11/942,825

(22) Filed: Nov. 20, 2007

(65) Prior Publication Data

US 2009/0129042 A1     May 21, 2009

(51) Int. Cl.
*H01R 43/00*     (2006.01)

(52) U.S. Cl. .............................. 29/868; 29/825; 29/831; 29/881; 174/382; 361/818

(58) Field of Classification Search ................... 29/868, 29/822, 824, 825, 831, 881; 174/382; 361/818; 385/75, 88, 92, 134
See application file for complete search history.

(56) References Cited

U.S. PATENT DOCUMENTS 6,713,672 B1 *    3/2004    Stickney ..................... 174/382

\* cited by examiner

*Primary Examiner*—Thiem Phan
(74) *Attorney, Agent, or Firm*—Morgan, Lewis & Bockius LLP

(57) ABSTRACT

A method for suppression of EMI emissions around an opening of an electronic enclosure that holds a physical layer switch. Fiber optic cables are installed on a plurality of ports attached to the switch such that the cables pass through the opening in the cabinet. The cables are divided into a plurality of discrete bundles. An enclosure is placed around each bundle while the enclosure is in an open state and thereafter the enclosure is closed such that the enclosure surrounds the bundle. The enclosure is designed such that it suppresses EMI emissions. After the enclosures are closed, they are positioned in an arrangement in the opening of the electronic enclosure.

4 Claims, 3 Drawing Sheets

METHOD FOR SUPPRESSION OF EMI EMISSIONS

FIELD OF THE INVENTION

The present invention is directed to a system and methods for electromagnetic interference (EMI) suppression in the openings of electronic enclosures that hold network equipment such as, for example, cabinets that hold physical layer switches.

BACKGROUND

EMI often takes the form of unwanted electromagnetic energy that negatively affects the operation of electrical equipment. EMI typically exists in the context of physical layer switches, where multiple bundles of fiber optic cables must be connected to the switch. The present disclosure provides a solution for suppressing EMI in this environment.

SUMMARY

The present invention is directed to a method for suppression of EMI emissions around an opening of an electronic enclosure that holds a physical layer switch. Fiber optic cables are installed on a plurality of ports attached to the switch such that the cables pass through the opening in the cabinet. The cables are divided into a plurality of discrete bundles. An enclosure is placed around each bundle while the enclosure is in an open state and thereafter the enclosure is closed such that the enclosure surrounds the bundle. The enclosure is made in a design that suppresses EMI emissions. After the enclosures are closed, they are positioned in an arrangement in the opening of the cabinet.

In a specific embodiment, each enclosure has a circular cross-section after the enclosure is closed, and a length greater than a waveguide frequency cut-off. When in the open state, each enclosure in the embodiment corresponds to a pair of opposing members each of which is semi-circular in cross-section. Each member of the pair has integrated connectors for joining together the opposing members to form the circular cross-section when the enclosure is closed. Each closed enclosure also has integrated connectors disposed at an end of the enclosure for securing the closed enclosure to a flat member having a plurality of openings. The flat member has integrated connectors disposed at each of the openings on the flat member. Each closed enclosure is secured to the flat member by snapping the integrated connectors disposed on the end of the enclosure into the integrated connectors disposed at an opening on the flat member. The flat member is secured to the opening of the cabinet.

DETAILED DESCRIPTION OF THE PREFERRED EMBODIMENTS

The present invention is implemented in an opening of an electronic enclosure that holds a physical layer switch. Fiber optic cables are installed on a plurality of ports attached to the switch such that the cables pass through the opening in the cabinet. After the fiber optic cables are installed on the switch ports, enclosures (described more fully below) are placed around the fiber optic cables and positioned in an arrangement in the cabinet opening in order to suppress EMI.

Figure 1:
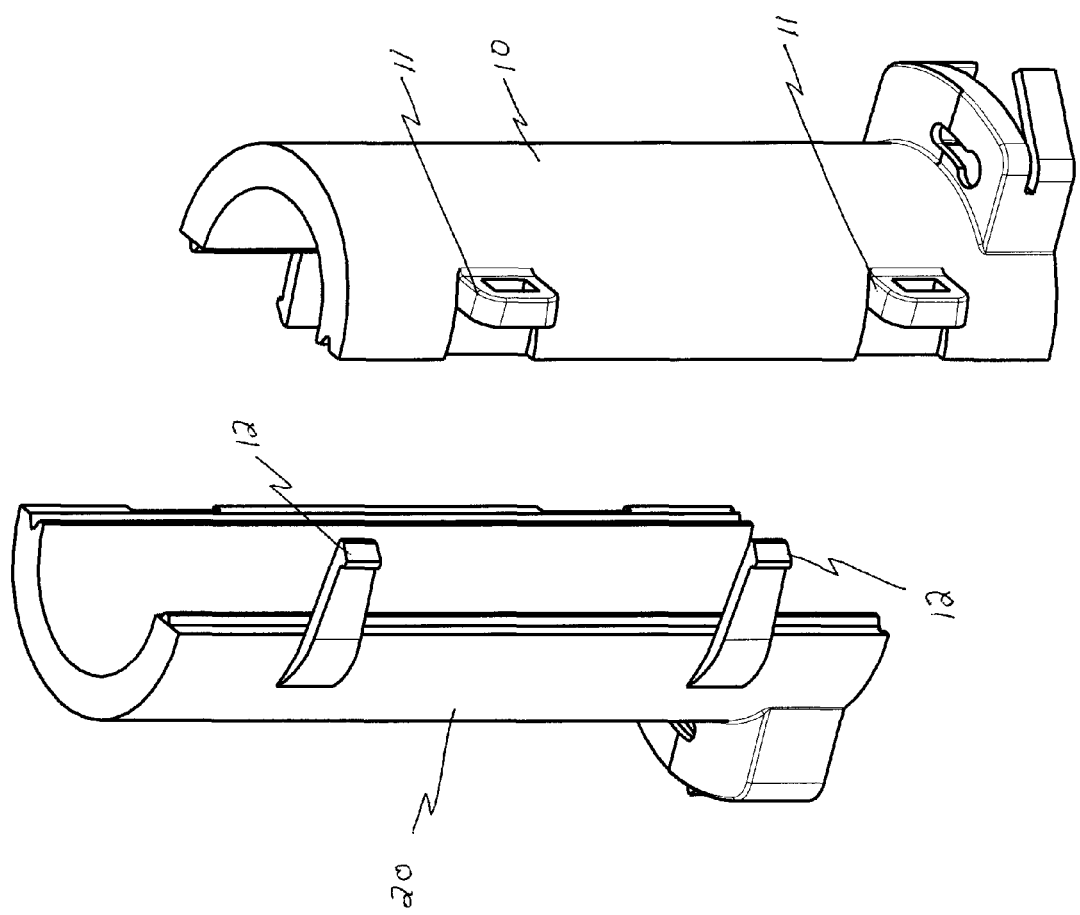
FIG. 1 is an exploded view of a pair of opposing members for forming an enclosure for holding fiber optic cables.

FIG. 1 is an exploded view of a pair of opposing members 10, 20 for forming an enclosure 30 (shown in FIG. 2) for holding the fiber optic cables. Each enclosure 30 has a circular cross-section after the enclosure is closed, and a diameter (D) that is sufficient to result in a waveguide frequency cut-off ($F_{co}$) that is higher than the frequencies of the signals carried by the fiber optic cables. The cutoff frequency for an enclosure that is round (e.g., enclosure 30) is calculated in accordance with equation (1) below:

$$F_{co}(\text{MHz}) = (6920 \text{ in}/\mu s)/D \tag{1}$$

where D is the diameter (in inches) of the enclosure.

When in the open state, each enclosure 30 corresponds to a pair of opposing members 10, 20 each of which is semi-circular in cross-section. Each member 10, 20 has integrated connectors 11, 12 for joining together the opposing members 10, 20 to form the circular cross-section when the enclosure is closed. In one embodiment, while portions of the installed fiber optic cables are positioned between members 10, 20, connectors 11, 12 are snapped together in order to join members 10, 20 in a closed state around a length of the installed fiber optic cables.

Figure 2:
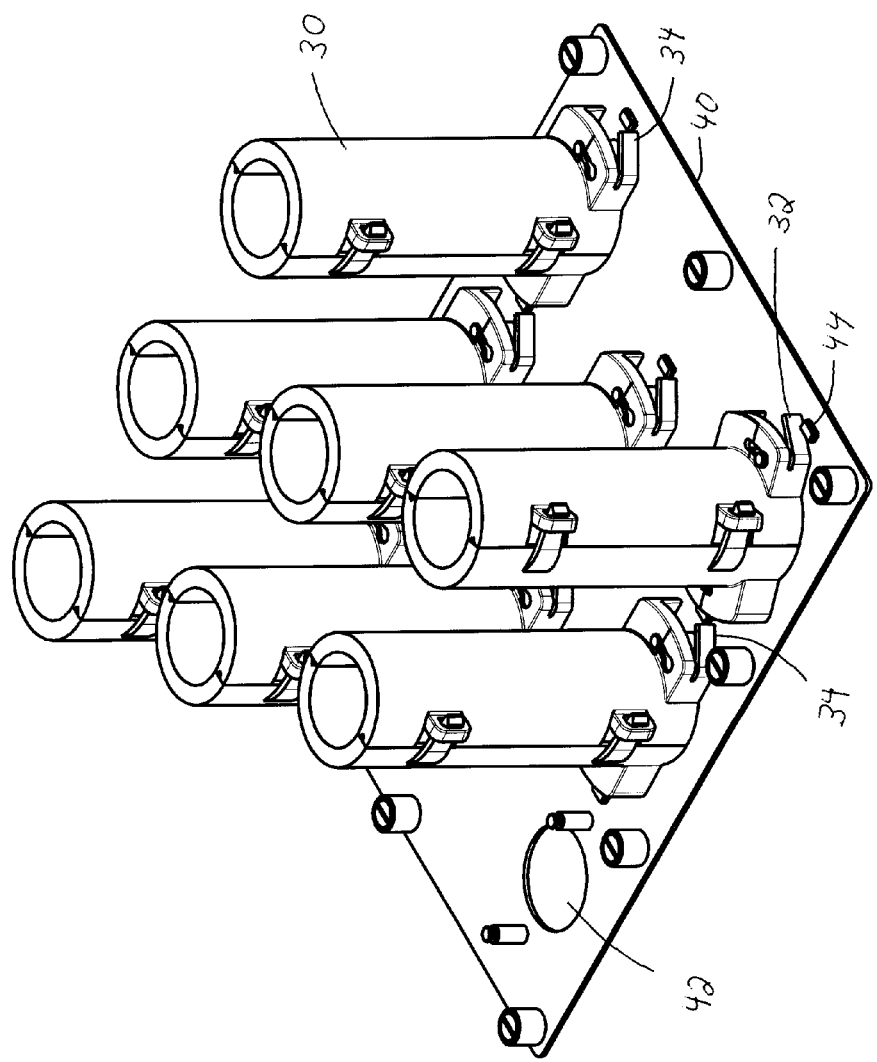
FIG. 2 shows enclosures (such as that shown in FIG. 1) in the closed state, and a flat member having a plurality of openings where closed enclosures are secured to the flat member.
Figure 3:
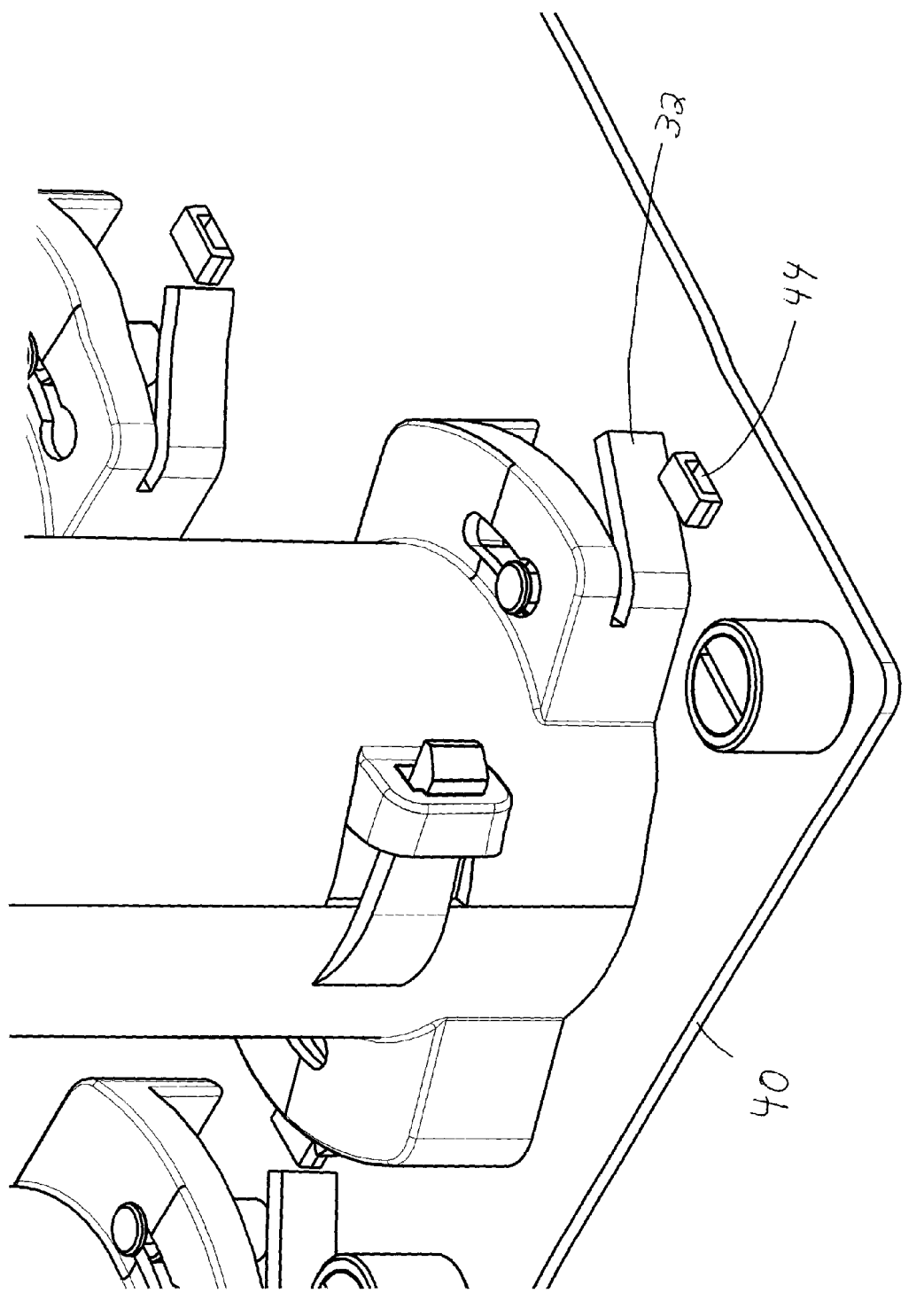
FIG. 3 is an exploded view illustrating the use of integrated connectors disposed at the ends of the enclosures and corresponding integrated connectors disposed at the openings on the flat member for securing the enclosures to the flat member.

Referring now to FIGS. 2-3, each closed enclosure 30 also has integrated connectors 32, 34 disposed at an end of the enclosure for securing the closed enclosure (with the installed fiber optic cables disposed therein) to a flat member 40 having a plurality of openings 42. The flat member 40 has integrated connectors 44 disposed at each of the openings on the flat member 40. Each closed enclosure 30 is secured to the flat member 40 by snapping the integrated connectors 34 disposed on the end of the enclosure into the integrated connectors 44 disposed at an opening on the flat member. In the embodiment shown in FIGS. 2-3, the enclosure 30 is secured to the flat member 40 by twisting the enclosure 30 until connectors 34 snap into connectors 42.

After the closed enclosures 30 (with the installed fiber optic cables disposed therein) are secured to the flat member 40, the flat member 40 is secured to the opening of the cabinet.

Finally, it will be appreciated by those skilled in the art that changes could be made to the embodiments described above without departing from the broad inventive concept thereof. It is understood, therefore, that this invention is not limited to the particular embodiments disclosed, but is intended to cover modifications within the spirit and scope of the present invention as defined in the appended claims.

What is claimed is:

1. A method for suppression of EMI emissions around an opening of an electronic enclosure that holds a physical layer switch, comprising:

(a) installing a plurality of fiber optic cables on a plurality of ports attached to the switch such that the cables pass through the opening in the cabinet;

(b) after step (a), dividing the cables into a plurality of discrete bundles, and for each bundle: placing an enclosure around the bundle while the enclosure is in an open state and thereafter closing the enclosure such that it surrounds the bundle, wherein after the closing the enclosure is positioned in the opening of the cabinet and wherein each closed enclosure has integrated connectors disposed at an end of the enclosure for securing the closed enclosure to a flat member having a plurality of openings, the flat member having integrated connectors disposed at each of the openings on the flat member; securing each closed enclosure to the flat member by snapping the integrated connectors disposed on the end of the enclosure into the integrated connectors disposed at an opening on the flat member; and securing the flat member to the opening of the cabinet;

and wherein the enclosure is made of a material that suppresses EMI emissions.

2. The method of claim 1, wherein each enclosure has a circular cross-section after the enclosure is closed, and a diameter that results in a cut-off frequency that exceeds the frequencies carried by the fiber optic cables.

3. The method of claim 2, wherein in the open state, each enclosure comprises a pair of opposing members each of which is semi-circular in cross-section.

4. The method of claim 3, wherein each member of the pair has integrated connectors for joining together the opposing members to form the circular cross-section when the enclosure is closed.

* * * * *